United States Patent
Noquil

(10) Patent No.: US 8,198,134 B2
(45) Date of Patent: Jun. 12, 2012

(54) DUAL SIDE COOLING INTEGRATED POWER DEVICE MODULE AND METHODS OF MANUFACTURE

(75) Inventor: Jonathan A. Noquil, Surigao del Sur (PH)

(73) Assignee: Fairchild Semiconductor Corporation, South Portland, ME (US)

(*) Notice: Subject to any disclaimer, the term of this patent is extended or adjusted under 35 U.S.C. 154(b) by 34 days.

(21) Appl. No.: 12/836,664

(22) Filed: Jul. 15, 2010

(65) Prior Publication Data
US 2011/0008933 A1    Jan. 13, 2011

Related U.S. Application Data

(62) Division of application No. 11/740,475, filed on Apr. 26, 2007, now Pat. No. 7,777,315.

(60) Provisional application No. 60/802,181, filed on May 19, 2006.

(51) Int. Cl.
*H01L 12/69* (2006.01)

(52) U.S. Cl. ........ 438/108; 438/109; 438/106; 438/123; 257/678; 257/738; 257/690; 257/E23.066; 257/E23.043

(58) Field of Classification Search .......... 257/678, 257/738, 690, 666, E23.066, E23.043, 675; 438/108, 106, 109, 123
See application file for complete search history.

(56) References Cited

U.S. PATENT DOCUMENTS

| 4,961,106 | A | 10/1990 | Butt et al. |
| 5,796,159 | A | 8/1998 | Kierse |
| 6,849,942 | B2 | 2/2005 | Lin et al. |
| 6,917,098 | B1 | 7/2005 | Yamunan |
| 2005/0280163 | A1 | 12/2005 | Schaffer et al. |
| 2005/0285238 | A1 | 12/2005 | Joshi et al. |
| 2006/0044772 | A1* | 3/2006 | Miura ........................ 361/767 |
| 2006/0151861 | A1 | 7/2006 | Noquil et al. |
| 2006/0186551 | A1 | 8/2006 | Lange et al. |
| 2007/0040254 | A1* | 2/2007 | Lopez ........................ 257/678 |
| 2007/0114352 | A1 | 5/2007 | Cruz et al. |
| 2007/0132073 | A1 | 6/2007 | Tiong et al. |

OTHER PUBLICATIONS

International Search Report from related PCT Application No. PCT/US2007/070611, filed Jul. 21, 2008) as published on Feb. 9, 2009 by the ISA/KR (2 pgs.).

* cited by examiner

*Primary Examiner* — Cuong Q Nguyen
*Assistant Examiner* — Cathy N Lam
(74) *Attorney, Agent, or Firm* — Hiscock & Barclay, LLP

(57) ABSTRACT

An integrated power device module including a lead frame having first and second spaced pads, one or more common source-drain leads located between the first and second pads, and one or more drain leads located on the outside of the second pad. First and second transistors are flip chip attached respectively to the first and second pads, wherein the source of the second transistor is electrically connected to the one or more common source-drain leads. A first clip is attached to the drain of the first transistor and electrically connected to the one or more common source-drain leads. A second clip is attached to the drain of the second transistor and electrically connected to the one or more drain leads located on the outside of the second pad. Molding material encapsulates the lead frame, the transistors, and the clips to form the module.

12 Claims, 8 Drawing Sheets

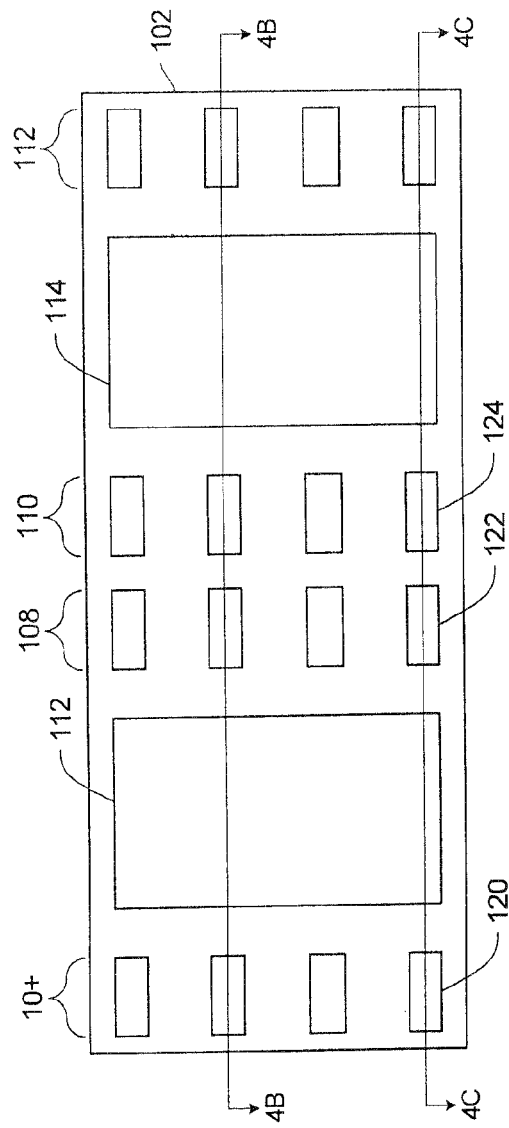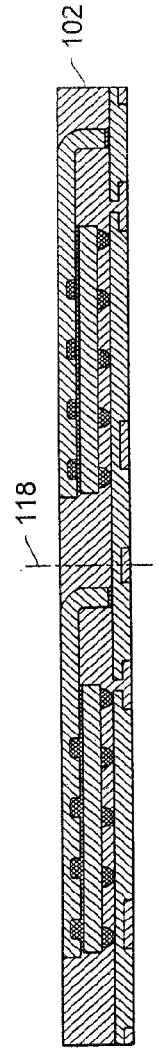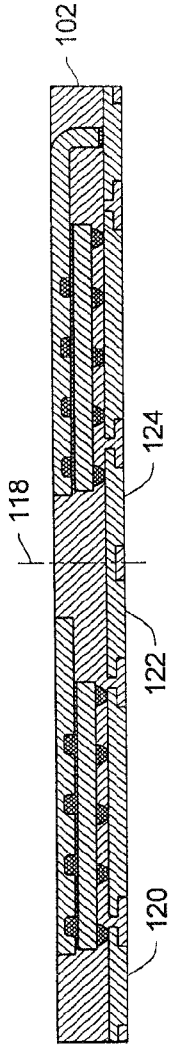
FIG. 4A
FIG. 4B
FIG. 4C

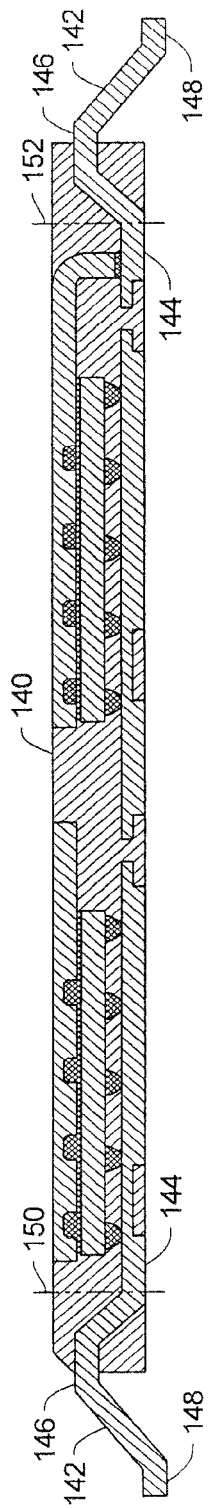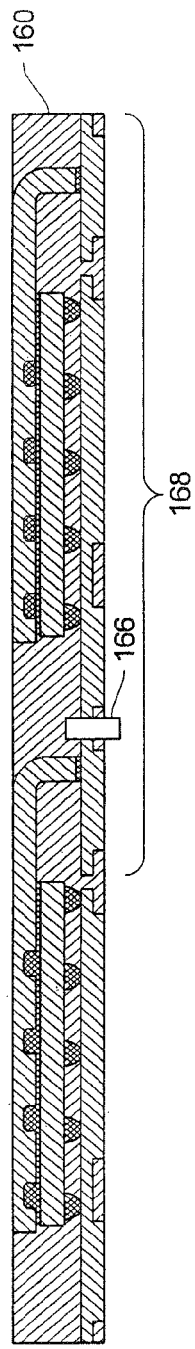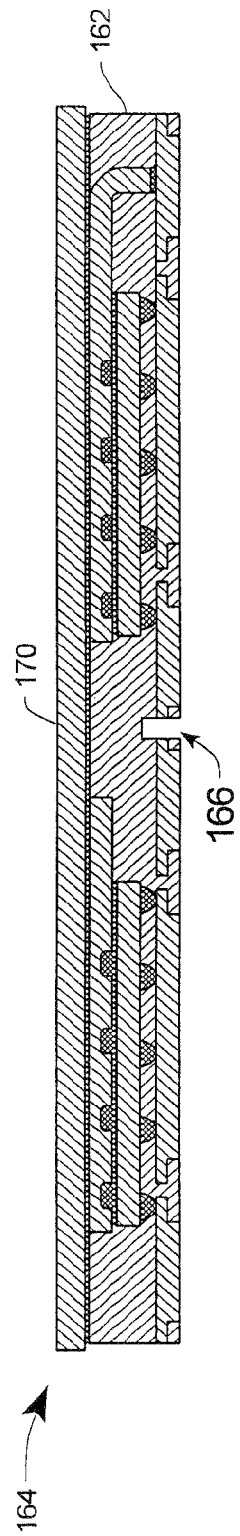
FIG. 5
FIG. 6A
FIG. 6B

DUAL SIDE COOLING INTEGRATED POWER DEVICE MODULE AND METHODS OF MANUFACTURE

CROSS-REFERENCE TO RELATED APPLICATIONS

This application is a divisional of U.S. patent application Ser. No. 11/740,475 filed Apr. 26, 2007 now U.S. Pat. No. 7,777,315, which claims priority from U.S. Provisional Patent Application Ser. No. 60/802,181, filed on May 19, 2006, which applications are hereby incorporated in their entirety by reference. Reference is also made to a related application Ser. No. 11/625,100, filed Jan. 19, 2007 entitled "Flip Chip MLP with Folded Heat Sink,".

FIELD OF THE INVENTION

This invention relates in general to packaging of semiconductor devices and more particularly to a dual side cooling integrated power device module and methods of making same.

BACKGROUND OF THE INVENTION

The arrangement of two power devices which have a common high current input or output terminal are found in such circuits as synchronous buck converters. Synchronous buck converters are commonly used as power supplies for cell phones, portable computers, digital cameras, routers, and other portable electronic devices. Synchronous buck converters shift DC voltage levels in order to provide power to programmable grid array integrated circuits, microprocessors, digital signal processing integrated circuits, and other circuits, while stabilizing battery outputs, filtering noise, and reducing ripple. These devices are also used to provide high current multiphase power in a wide range of data communications, telecommunications, point-of-load and computing applications.

FIG. 1 shows a block diagram of a typical synchronous buck converter 10. The converter has a high side FET 12 and a low side FET 14 which are driven by a pulse width modulation (PWM) IC 16. The Q1 and Q2 devices 12, 14 can be configured as discrete devices which require optimal layout to reduce parasitic resistances 18 and inductances 20 caused by the connection of the source of high side FET 12 to the drain of the low side FET 14 on a printed circuit board (PCB).

US Patent Application Publication No. 2005/0285238 A1, published Dec. 29, 2005, inventors Joshi et al., discloses an integrated transistor module including a lead frame that defines a low side land and a high side land. A low side transistor is mounted on the low side land with its drain electrically connected to the low side land. A high-side transistor is mounted on the high-side land with its source electrically connected to the high side land. A stepped portion of the lead frame electrically connects the low and high side lands and thus also the drain of the low-side transistor with the source of the high-side transistor.

Although the integrated transistor module of the latter published patent publication is useful for the applications for which it was intended, the module footprint is not a common one in the industry.

There is thus a need for an improved integrated power device module that can be used in circuits such as synchronous buck converter circuits that offer a solution to these problems.

SUMMARY OF THE INVENTION

According to the present invention there is provided a solution to these problems.

According to a feature of the present invention, there is provided an integrated power device module comprising:

a lead frame having first and second spaced pads and one or more common source-drain leads located between said first and second pads;

first and second transistors flip chip attached respectively to said first and second pads, wherein the source of said second transistor is electrically connected to said one or more common source-drain leads; and a first clip attached to the drain of said first transistor and electrically connected to said one or more common source-drain leads.

According to another feature of the present invention there is provided an integrated power device module comprising:

a lead frame having first and second spaced pads, one or more common source-drain leads located between said first and second pads, and one or more drain leads located on the outside of said second pad;

first and second transistors flip chip attached respectively to said first and second pads, wherein the source of said second transistor is electrically connected to said one or more common source-drain leads;

a first clip attached to the drain of said first transistor and electrically connected to said one or more common source-drain leads;

a second clip attached to the drain of said second transistor and electrically connected to said one or more drain leads located on the outside of said second pad; and molding material encapsulating said lead frame, said transistors, and said clips to form said module.

According to a further feature of the present invention there is provided a method of making an integrated power device module comprising:

providing a lead frame having first and second spaced pads, one or more common source-drain leads located between said pads and one or more drain leads located on the outside of said second pad;

flip chip attaching first and second transistors respectively to said first and second pads, wherein the source of said second transistor is electrically connected to said one or more common source-drain leads;

attaching a first clip to the drain of said first transistor and electrically connecting said first clip to said one or more common source-drain leads;

attaching a second clip to the drain of said second transistor and electrically connecting said second clip to said one or more drain leads located on the outside of said second pad; and encapsulating said lead frame, said transistors, and said clips with molding material to form said module.

BRIEF DESCRIPTION OF THE DRAWINGS

The aforementioned and other features, characteristics, advantages, and the invention in general will be better understood from the following more detailed description taken in conjunction with the accompanying drawings, in which:

FIG. 4A is a bottom plan view of a dual side cooling integrated power device module according to another embodiment of the present invention;

FIG. 4B is a cross section side view of one embodiment of the module shown in FIG. 4A;

FIG. 4C is a cross section side view of another embodiment of the module shown in FIG. 4A;

FIG. 5 is a cross section side view of a leaded dual side cooling integrated power device module according to still another embodiment of the present invention;

FIGS. 6A and 6B are cross section side views of modifications of the module shown in FIG. 4C to form a dual side cooling integrated power device module according to yet another embodiment of the present invention;

Figure 1:
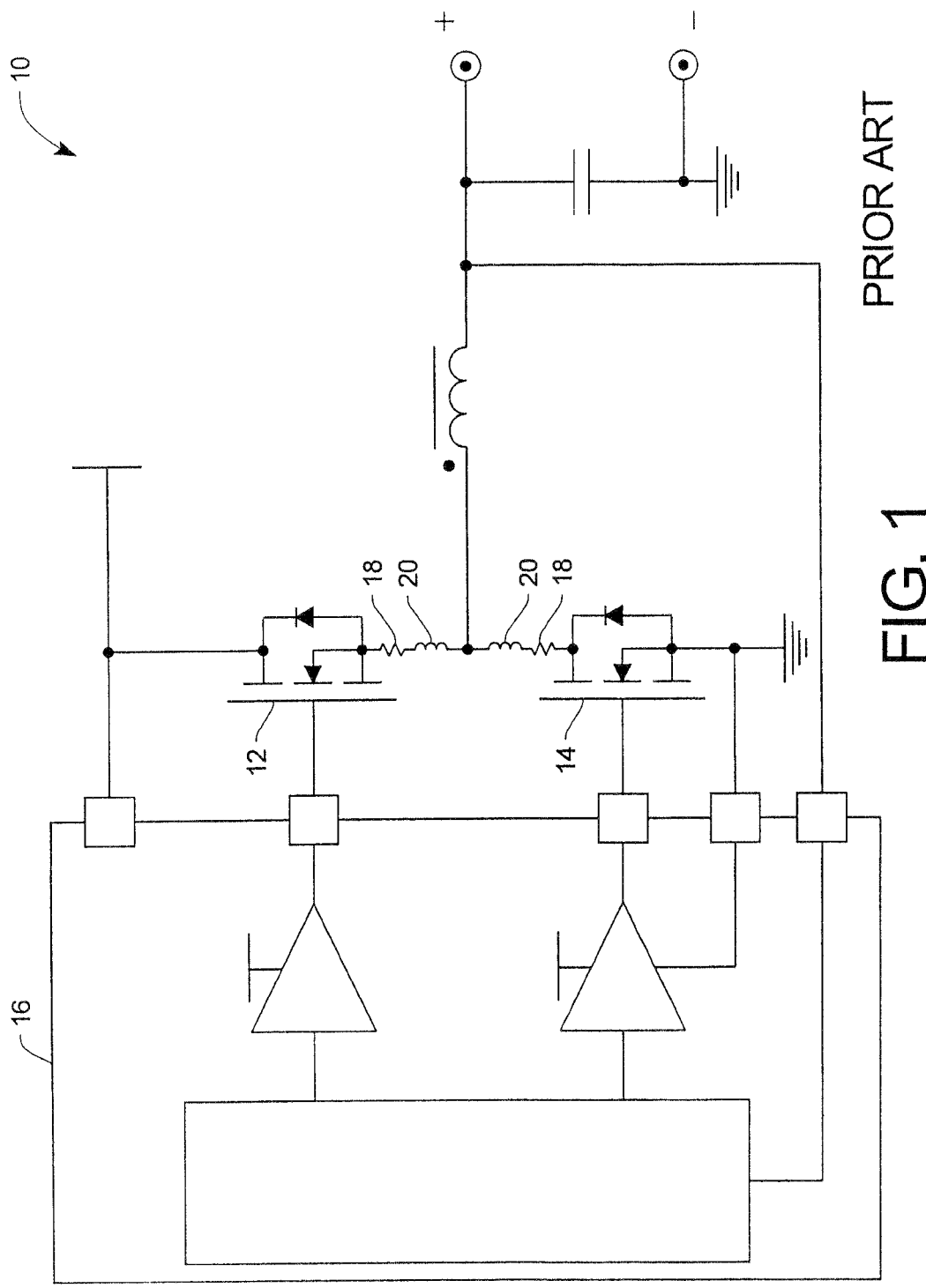
FIG. 1 is a schematic diagram of a typical synchronous buck converter circuit.

It will be appreciated that for purposes of clarity and where deemed appropriate, reference numerals have been repeated in the figures to indicate corresponding features. Also, the relative size of various objects in the drawings has in some cases been distorted to more clearly show the invention.

DESCRIPTION OF THE INVENTION

Figure 2A:
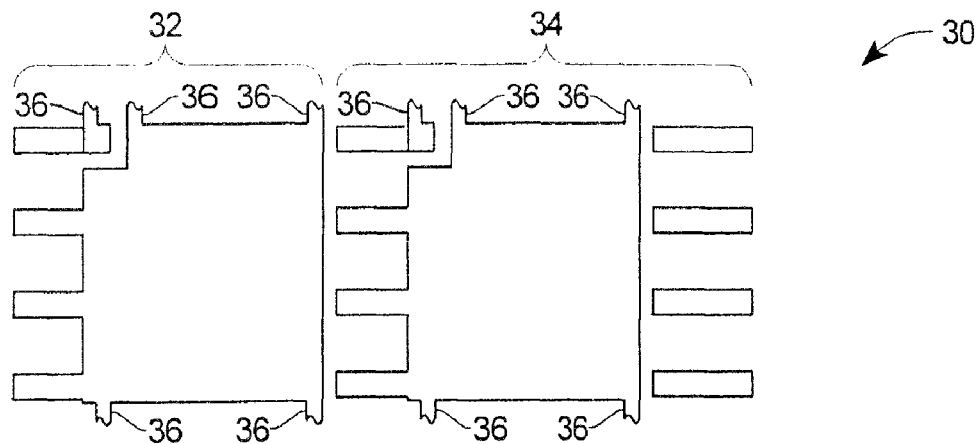
FIG. 2A is a plan view of two lead frames of the type used to form a dual side cooling integrated power device module according to one embodiment of the present invention.
Figure 2B:
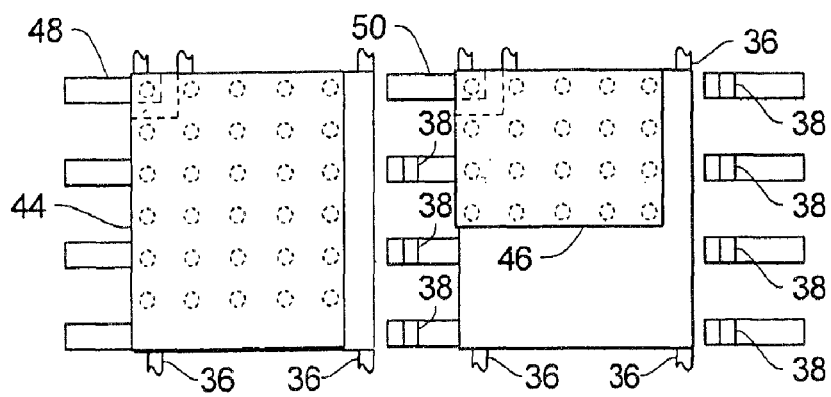
FIG. 2B is a plan view of the lead frames shown in FIG. 2A with transistor dies bonded to the lead frames according to one embodiment of the present invention.
Figure 2C:
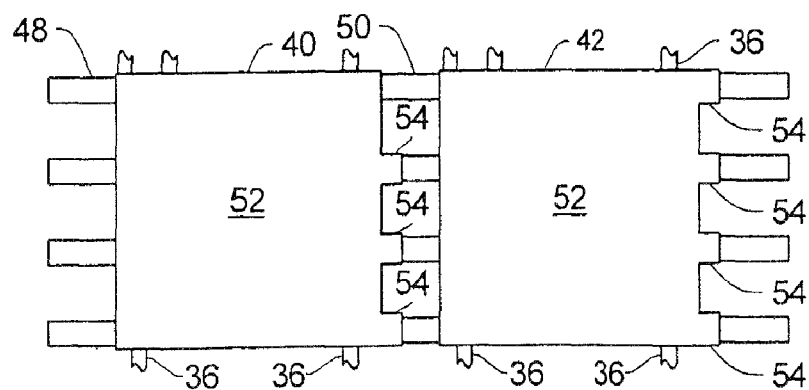
FIG. 2C is a plan view of the lead frames of FIG. 2A with two cooling chips attached to lead frames shown in FIG. 2A and the transistor dies shown in FIG. 2B according to one embodiment of the present invention.

FIG. 2A is a plan view 30 of two lead frames 32 and 34 of the type used to form a dual side cooling integrated power device module according to one embodiment of the present invention. The lead frames 32, 34 have connecting bars 36 which are shown in FIGS. 2A-2C and removed in a singulation process after the encapsulation operation, are not shown in the other figures to avoid cluttering the figures. The connecting bars allow the lead frames 32, 34 to be placed in gang and fabricated in one reel. As shown in FIG. 2B solder paste 38 is applied to the leads of the lead frames 32, 34 which will be soldered to two clips 40 and 42 and two power devices 44 and 46 are flipped over and placed onto the lead frames 32 and 34, respectively. The power devices 44, 46 are coated with solder during the manufacture of the chips. In FIG. 2C the two clips 40, 42 are placed over the lead frames 32, 34 and the power devices 44, 46, respectively, and the module is heated to bond the power devices 44, 46 to the lead frames 32, 34, and to reflow the solder paste on the appropriate leads of the lead frames 32, 34 and on the back side of the power devices 44, 46, respectively. For simplicity of discussion the power devices 44, 46 will hereinafter be referred to as MOSFETs 44, 46 although the present invention is not limited to MOSFETs or MOSFETs alone. For example, the diodes across the sources and drains of the FETs 12 and 14 would possibly be part of the power devices 44 and 46.

As can be seen in FIG. 2B leads 48 and 50 are connected to the respective gates of the MOSFETs 44, 46, respectively, and these leads are electrically isolated from the rest of the respective lead frames 32, 34 after the singulation process. The portions of the lead frames 32, 34 not connected to the leads 48 or 50 are connected to the sources of the MOSFETs 44, 46, respectively. The drains of the MOSFETs 40, 46 are soldered to clips 40, 42, respectively.

The clips 40, 42 have planar members 52 and a plurality of downwardly extending leads 54 which are soldered to the leads with solder paste 38 during the reflow soldering process. As a result the source of the MOSFET 44 is connected to the drain of the MOSFET 46 by the clip 40.

Figure 3A:
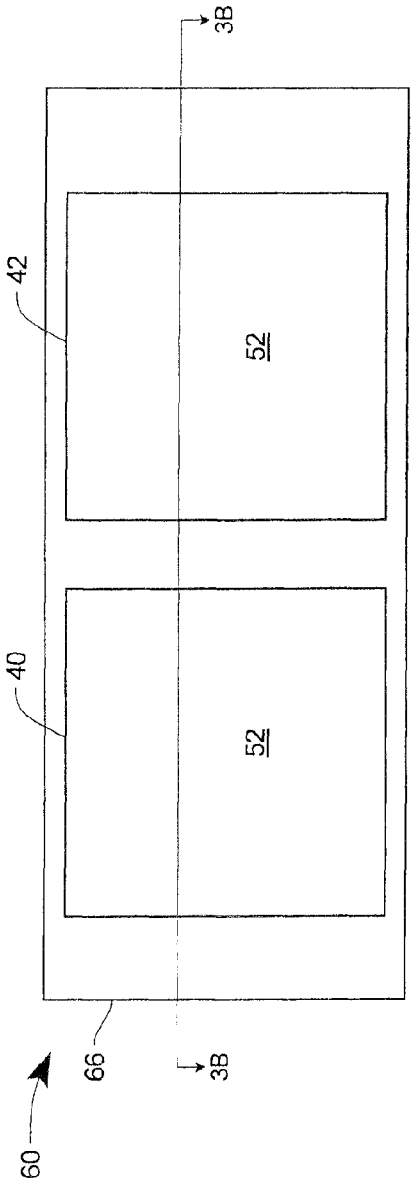
FIGS. 3A, 3B, and 3C are respective top plan, cross section side, and bottom plan views of the structure shown in FIG. 2C after the structure has been partially encased in encapsulation material.
Figure 3B:
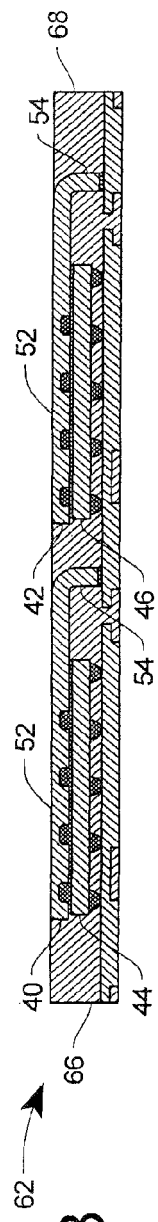
Figure 3C:
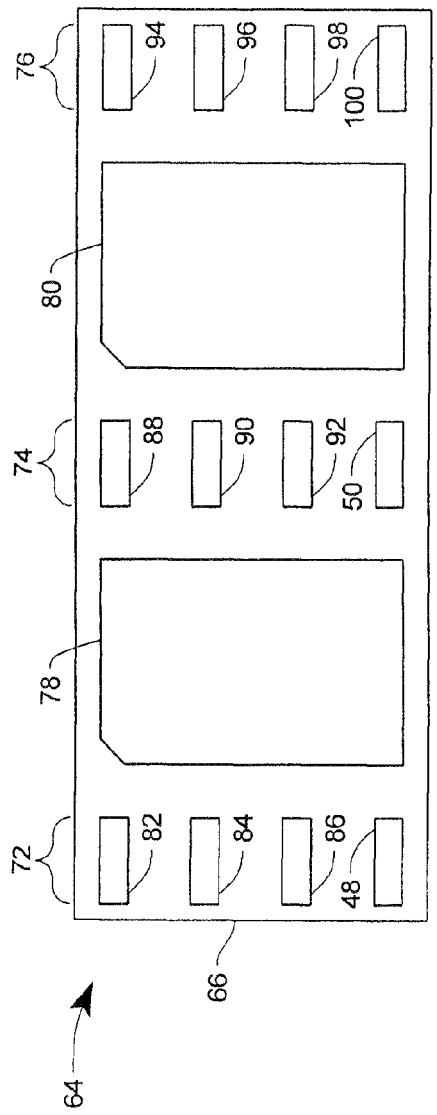

FIGS. 3A, 3B, and 3C are respective top plan 60, cross section side 62, and bottom plan 64 views of an integrated power device module 66 which is the structure shown in FIG. 2C partial encapsulated with encapsulating material 68 such as epoxy. The cross section view of FIG. 3B is along the line 3B-3B in FIG. 3A. The planar members 52 are exposed at the top of the module 70 in FIG. 3A. As shown in FIG. 3C the bottom of the module 70 has a column of lead lands 72, 74, and 76 along with exposed source pads 78 and 80 which are part of the lead frames 32, 34. Leads 82, 84, and 86 are connected to the source of the MOSFET 44 as is the source pad 78. Leads 88, 90, and 92 are the common connection of the drain of the MOSFET 44 and the source of the MOSFET 46, and leads 94, 96, 98, and 100 are connected to the emitter of the MOSFET 46 by the clip 42.

The module 70 is appropriate for use in the synchronous buck converter 10 of FIG. 1 by replacing the two discrete FETs 12 and 14 with module 70 with the FET 12 replaced by the MOSFET 44, and the FET 14 replaced by the MOSFET 46. By using the module 70, with the clip 40 providing the electrical connection of the drain of the low side MOSFET 44 to the source of the high side MOSFET 46, the two MOSFETs 44, 46 are physically closer together and parasitic resistances 18 and inductances 20 are substantially reduced. Moreover, cooling of the power FETs is improved by the inherent heat sinking characteristics of the clips 40, 42, the top surfaces 56 of which are not encapsulated. The cooling is further improved by dual side cooling since the sources of the two devices are exposed via the lead frame to which they are attached. The method of forming the module 70 also results in improved solder joint reliability since a single solder reflow is required rather than multiple solder reflows.

FIGS. 4A, 4B, and 4C are bottom plan and side cross section views of a dual side cooling integrated power device module 102 according to another embodiment of the present invention. The bottom plan view of FOG. 4A shows four columns of lead lands 106, 108, 110, and 112 along with the source pads 114 and 116. When the module 102 is manufactured, the leads in columns 108 and 110 are connected together as shown in FIGS. 4B and 4C, but are designed such that the module 102 can be split into two separate single power device modules by severing the module 102 along the line 118 shown in FIGS. 4B and 4C separating the leads in column 108 from the leads in column 110. The cross section views in FIGS. 4B and 4C are taken along the lines 4B-4B and 4C-4C, respectively, in FIG. 4A. In FIG. 4C the lead lands 120, 122, and 124 are the gate lands for the MOSFETs 36, 38. If the module 102 was split along line 118, lead land 122 would become isolated.

FIG. 5 is a cross section side view of a leaded dual side cooling integrated power device module 140 according to still another embodiment of the present invention. The 140 has external leads 142 which are integral with the land pads 144 at the ends of the module 140. The land pads 144 are exposed at the bottom of the module 140 as in the previous embodiments, but extend out of the encapsulation by stepping upward to a first horizontal section 146 that exits the end of the module 140 above the bottom plane of the module 140, and then steps down to a second horizontal section 148 to line up approximately with the bottom plane of the module 140. This leaded module 140 can thus accommodate a leaded package footprint. The external leads 142 can be removed to form a leadless module by cutting the end portions of the module 140 at the lines 150 and 152.

FIGS. 6A and 6B are respective cross section side views 160 and 162 of modifications of the module shown in FIG. 4C to form a dual side cooling integrated power device module 164 according to yet another embodiment of the present invention in which the drains of the two MOSFETs 36 and 38 are connected together to form a common drain. In FIG. 6A a sawn cutout 166 is made in the lead frame 168 to isolate the MOSFETs 36 and 38. In FIG. 6B an electrical and thermally conductive heat sink 170 is attached to the planar members 54 of the clips 44, 46 to form the common drain connection.

Figure 7A:
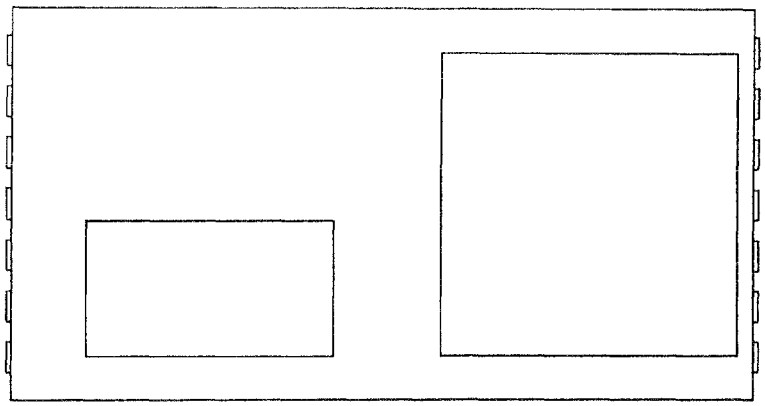
FIGS. 7A, 7B, and 7C are respective top plan, a partial cross section top plan, and bottom plan views of a dual side cooling integrated power device module according to a further another embodiment of the present invention with a control IC for driving the two power devices.
Figure 7B:
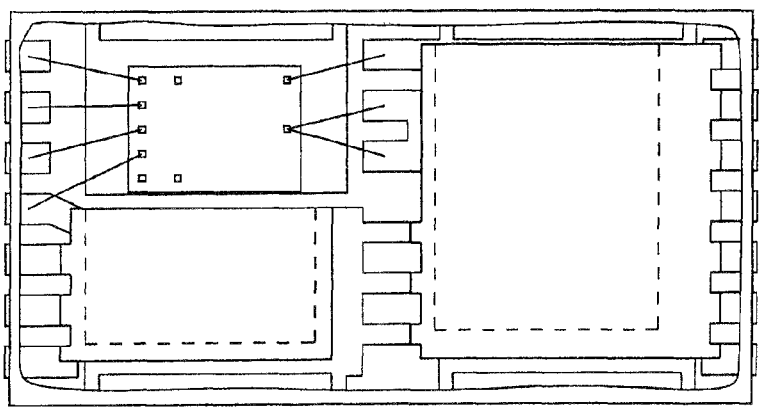
Figure 7C:
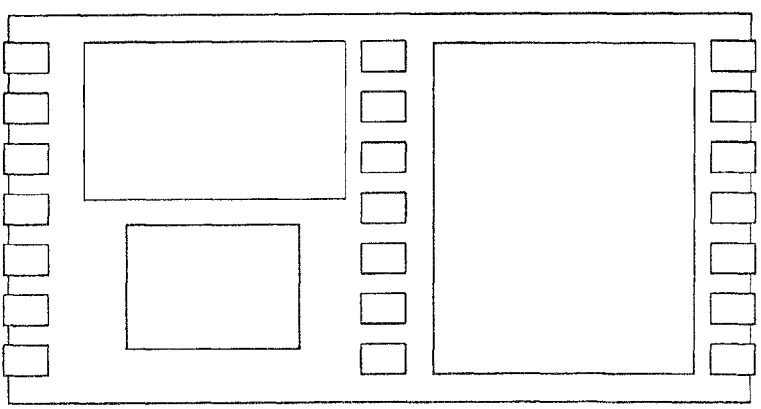

FIGS. 7A, 7B, and 7C are respective top plan, a partial cross section top plan, and bottom plan views of a dual side cooling integrated power device module 180 according to a further another embodiment of the present invention which includes a control IC 182 for driving the two MOSFETs 44, 46 which have customized clips 184 and 186, respectively, for connecting the drain of the MOSFET 44 to the source of the MOSFET 46 and for providing cooling for the MOSFETs 44, 46. FIG. 7A is the top plan view showing the respective planar members 188 and 190 of the clips 184, 186 which are exposed in the top of the module 180. As shown in FIG. 7C the module 180 has three columns of lead lands 192, 194, and 196 with the end lead lands extending past the end of the encapsulating material 198. FIG. 7B is a top plan view in partial cross section of the module 180. The control IC 182 has a plurality of wire bonds 200 to some of the lead lands in column 192 and to the gate and source of the MOSFET 46. The shape of the clips 184, 186 and the footprint of the module 180 are different than any of the previously described modules illustrating the flexibility of the present invention.

Figure 8A:
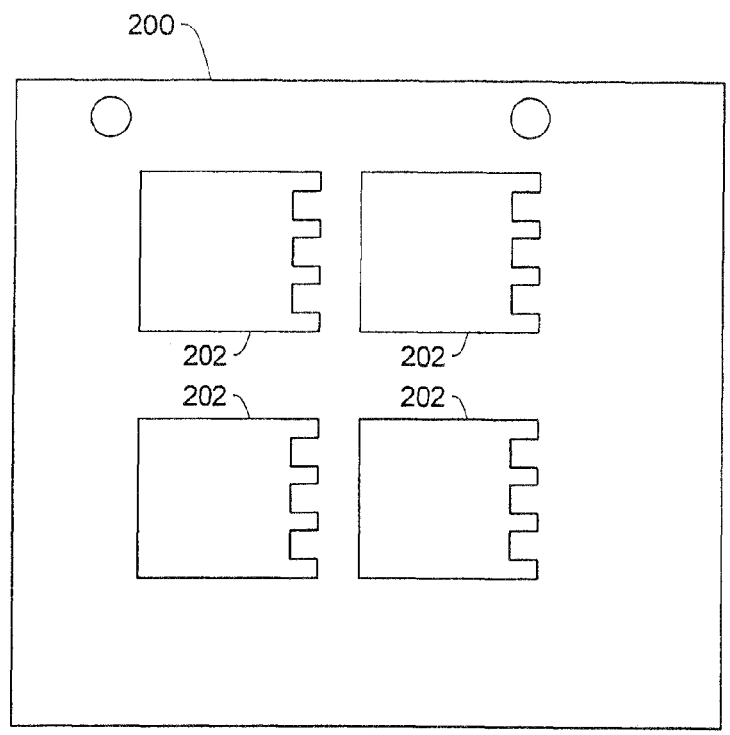
FIG. 8A is a top view of a metal plate showing the outline of four clips which are to be punched from the metal frame for use in one of the embodiments of the present invention.
Figure 8B:
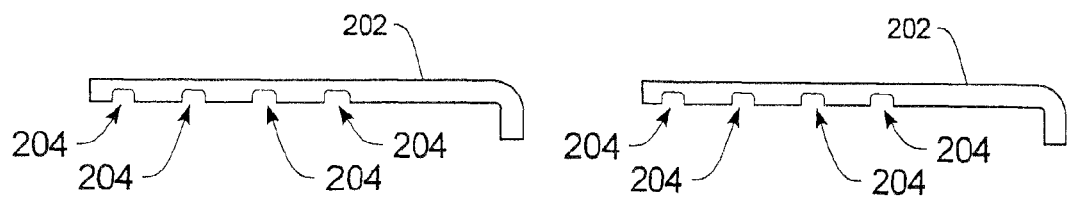
FIG. 8B are side views of two of the clips after they have been punched out of the metal plate shown in FIG. 8A and formed into the clips used in FIG. 3B.

FIG. 8A is a top view of a metal plate 200 showing the outline of four clips 202 which are to be punched from the metal frame using a well known operation for use in one of the embodiments of the present invention. Thus the clips 202 can be placed in gang and fabricated in one reel. FIG. 8B are side views of two of the clips 202 after they have been punched out of the metal plate shown in FIG. 8A and formed into the clips used in FIG. 3B. As shown in FIG. 8B, the clips 202 have grooves 204 formed in them to improve solder attachment.

Figure 9A:
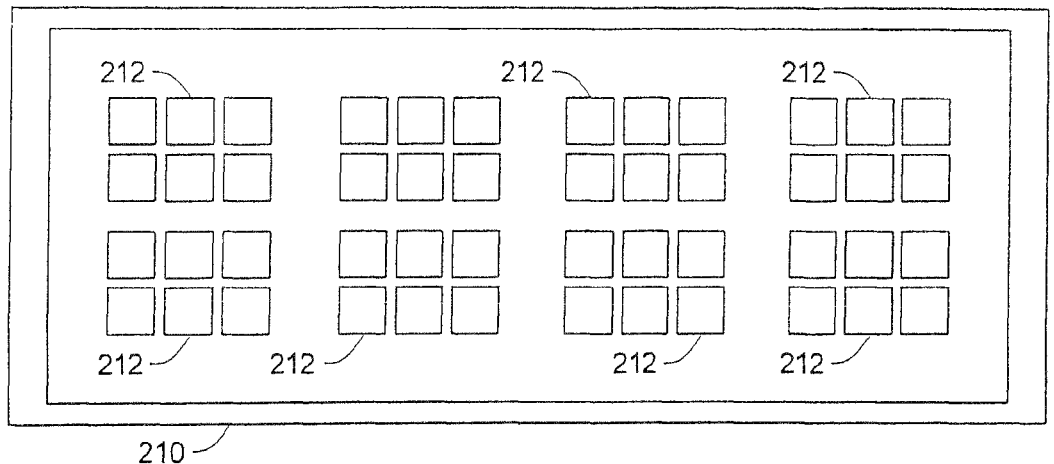
FIG. 9A is a top plan view of a block mold of a plurality of partially encapsulated modules.
Figure 9B:
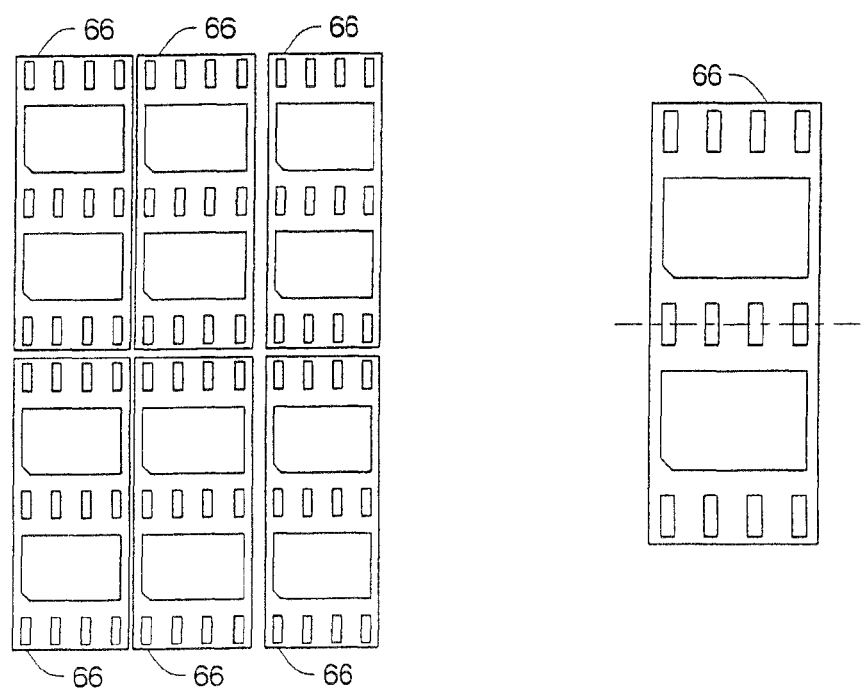
FIG. 9B is a bottom view of one type of encapsulated modules shown in FIG. 9A after they have been singulated.

FIG. 9A is a top plan view of a block mold 210 of a plurality of partially encapsulated modules 212. In the molding of the case leaded modules 140 shown in FIG. 5, the modules 140 would be formed as a singulated mold. FIG. 9B is a bottom view of the type of encapsulated modules 66 shown in FIGS. 3A-3C after they have been singulated from the block mold 210. It will be appreciated that any of the leadless modules can be formed in the block mold 210.

The invention has been described in detail with particular reference to certain preferred embodiments thereof, but it will be understood that variations and modifications can be effected within the spirit and scope of the invention.

The invention claimed is:

1. A method of making an integrated transistor module comprising:
    providing a planar lead frame having first and second spaced pads, one or more common source-drain leads located between said pads and one or more drain leads located on the outside of said second pad;
    flip chip attaching first and second transistors respectively to said first and second pads, each transistor having source, gate and drain electrodes, wherein the source of said second transistor is electrically connected to said one or more common source-drain leads;
    attaching a first clip to the drain of said first transistor and electrically connecting said first clip to said one or more common source-drain leads, said first clip having a planar member;
    attaching a second clip to the drain of said second transistor and electrically connecting said second clip to said one or more drain leads located on the outside of said second pad, said second clip having a planar member; and
    partially encapsulating in molding material said planar lead frame, said transistors, and said clips with a portion of bottom surfaces of each of said first and second pads and said planar members of said clips being exposed to provide dual cooling of said integrated transistor module.

2. The method of claim 1 wherein said pads of the lead frame and said clips are exposed and free from molding material to provide dual cooling of said module.

3. The method of claim 1 wherein said first and second transistors are metal oxide semiconductor field effect transistors (MOSFET).

4. The method of claim 1 wherein said first and second transistors are respectively high side and low side power transistors that are components of a buck converter.

5. The method of claim 1 further comprising attaching an integrated circuit to said lead frame and electrically connecting said integrated circuit to said first and second transistors, said integrated circuit being encapsulated by said molding material to form a single module.

6. A method of making an integrated transistor module comprising:
    providing a planar lead frame having first and second spaced pads, one or more common source-drain leads located between said pads and one or more drain leads located on the outside of said second pad;
    flip chip attaching first and second transistors respectively to said first and second pads, each transistor having source, gate and drain electrodes, wherein the source of said second transistor is electrically connected to said one or more common source-drain leads;
    attaching a first clip to the drain of said first transistor, said first clip having a planar member and a plurality of downwardly extending leads, and electrically connecting said first clip to said one or more common source-drain leads;
    attaching a second clip to the drain of said second transistor and electrically connecting said second clip to said one or more drain leads located on the outside of said second pad; and
    partially encapsulating in molding material said lead frame, said transistors, and said clips with a portion of bottom surfaces of each of said first and second pads and said planar members of said clips being exposed to provide dual cooling of said module.

7. The method of claim 6 wherein the module further comprises leads extending outside the molding material.

8. The method of claim 6 wherein said first and second transistors are metal oxide semiconductor field effect transistors (MOSFET).

9. The method of claim 6 wherein said first and second transistors are respectively high side and low side power transistors that are components of a buck converter.

10. The method of claim 6 comprising the further steps of severing the lead frame between the first and second pads and attaching an electrical and thermal conductive third clip to the exposed portions of the first and second clips.

11. The method of claim 6 further comprising attaching an integrated circuit to said lead frame and electrically connecting said integrated circuit to said first and second transistors, said integrated circuit being encapsulated by said molding material to form a single module.

12. A method comprising:
   providing a planar lead frame having first and second spaced pads, one or more common source-drain leads located between said pads and one or more drain leads located on the outside of said second pad;
   flip chip attaching first and second transistors respectively to said first and second pads, each transistor having source, gate and drain electrodes, wherein the source of said second transistor is electrically connected to said one or more common source-drain leads;
   attaching a first clip to the drain of said first transistor, said first clip having a planar member and a plurality of downwardly extending leads, and electrically connecting said first clip to said one or more common source-drain leads;
   attaching a second clip to the drain of said second transistor;
   partially encapsulating in molding material said lead frame, said transistors, and said clips with a portion of bottom surfaces of each of said first and second pads and said planar members of said clips being exposed to provide dual cooling of said module; and
   separating the partially encapsulated first transistor is separated from the partially encapsulated second transistor to provide two separate transistors.

* * * * *